(12) United States Patent
Paraschiv et al.

(10) Patent No.: US 10,957,793 B2
(45) Date of Patent: Mar. 23, 2021

(54) METHOD OF FORMING TARGET LAYER SURROUNDING VERTICAL NANOSTRUCTURE

(71) Applicant: IMEC vzw, Leuven (BE)

(72) Inventors: Vasile Paraschiv, Bornem (BE); Guglielma Vecchio, Kessel-Lo (BE); Anabela Veloso, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/128,386

(22) Filed: Sep. 11, 2018

(65) Prior Publication Data

US 2019/0097047 A1    Mar. 28, 2019

Related U.S. Application Data

(63) Continuation of application No. PCT/EP2017/054465, filed on Feb. 27, 2017.

(30) Foreign Application Priority Data

Mar. 11, 2016    (EP) .................................... 16159969

(51) Int. Cl.
*H01L 29/78*    (2006.01)
*H01L 21/311*    (2006.01)
(Continued)

(52) U.S. Cl.
CPC .... *H01L 29/7827* (2013.01); *H01L 21/02601* (2013.01); *H01L 21/02603* (2013.01);
(Continued)

(58) Field of Classification Search
CPC ........... H01L 29/7827; H01L 21/02601; H01L 29/0665; H01L 29/7851; H01L 29/0669;
(Continued)

(56) References Cited

U.S. PATENT DOCUMENTS 5,811,335 A * 9/1998 Santangelo ....... H01L 29/66333
                                                    438/268
5,962,345 A * 10/1999 Yen ................... H01L 21/02063
                                                    257/E21.577
(Continued)

FOREIGN PATENT DOCUMENTS

EP    2 180 314 A1    4/2010

OTHER PUBLICATIONS

B. Yang et al., CMOS compatible gate-all-around vertical silicon nano-wire MOSFETs, 44th European Device Research Conference (ESSDERC), Nov. 18, 2008, pp. 318-321. (Year: 2008).*

(Continued)

*Primary Examiner* — Charles D Garber
*Assistant Examiner* — S M Sohel Imtiaz
(74) *Attorney, Agent, or Firm* — Knobbe, Martens, Olson & Bear, LLP

(57) ABSTRACT

The disclosed technology generally relates to semiconductor fabrication, and more particularly to a method of forming a target layer surrounding a vertical nanostructure. In one aspect, a method includes providing a substrate having a substrate surface. The method additionally includes forming a vertical nanostructure extending outwardly from a substrate surface. The vertical nanostructure has a sidewall surface, where the sidewall surface has an upper portion and a lower portion. The method additionally includes forming a target layer at least along the sidewall surface of the vertical nanostructure and on the substrate surface. The method additionally includes forming a protection layer covering the target layer and removing an upper portion of the protection layer, thereby exposing the target layer along the upper portion of the sidewall surface of the vertical nanostructure. Thereafter, the exposed target layer is removed along the upper portion of the sidewall surface of (Continued)

the vertical nanostructure selective towards the protection layer. Thereafter, the remaining protection layer is removed.

15 Claims, 7 Drawing Sheets

(51) Int. Cl.
- *H01L 29/66* (2006.01)
- *H01L 29/06* (2006.01)
- *H01L 21/02* (2006.01)

(52) U.S. Cl.
CPC .... *H01L 21/31144* (2013.01); *H01L 29/0665* (2013.01); *H01L 29/0669* (2013.01); *H01L 29/0676* (2013.01); *H01L 29/66666* (2013.01); *H01L 29/7851* (2013.01)

(58) Field of Classification Search
CPC ......... H01L 21/02603; H01L 21/31144; H01L 29/66666; H01L 29/0676
See application file for complete search history.

(56) References Cited

U.S. PATENT DOCUMENTS

| | | | | |
|---|---|---|---|---|
| 2006/0099818 A1* | 5/2006 | Fan | | H01L 21/31111 438/749 |
| 2010/0210096 A1* | 8/2010 | Masuoka | | H01L 21/84 438/585 |
| 2011/0186797 A1* | 8/2011 | Herner | | H01L 27/2418 257/2 |
| 2011/0253981 A1* | 10/2011 | Rooyackers | | B82Y 10/00 257/24 |
| 2013/0270508 A1* | 10/2013 | Li | | H01L 45/1206 257/4 |
| 2014/0103423 A1* | 4/2014 | Ohlsson | | B82Y 10/00 257/329 |
| 2014/0225184 A1* | 8/2014 | Colinge | | H01L 23/535 257/329 |
| 2014/0264897 A1* | 9/2014 | Chiu | | H01L 27/11568 257/773 |
| 2015/0144866 A1* | 5/2015 | Masuoka | | H01L 27/2454 257/5 |
| 2015/0179755 A1* | 6/2015 | Rooyackers | | H01L 29/6681 257/24 |
| 2015/0372140 A1* | 12/2015 | Liu | | H01L 29/66818 257/190 |
| 2017/0125518 A1* | 5/2017 | Oxland | | H01L 21/3212 |

OTHER PUBLICATIONS

B Yang, CMOS compatible gate-all-around vertical silicon nanowire MOSFETs, 2008 (Year: 2008).*

Yang et al., CMOC Compatible Gate-All-Around Vertical Silicon-Nanowire MOSFETs, Institute of Microelectronics, 2008; 4 pages.

PCT Search Report and Written Opinion dated May 10, 2017 in PCT Application No. PCT/EP2017/054465; 15 pages.

* cited by examiner

METHOD OF FORMING TARGET LAYER SURROUNDING VERTICAL NANOSTRUCTURE

CROSS-REFERENCE TO RELATED APPLICATIONS

This application is a continuation of PCT Application No. PCT/EP2017/054465, filed on Feb. 27, 2017, which claims priority to European application EP 16159969.1, filed on Mar. 11, 2016. Each of the above applications is incorporated herein by reference in its entirety.

BACKGROUND

Field

The disclosed technology generally relates to semiconductor fabrication, and more particularly to a method of forming a target layer surrounding a vertical nano structure.

Description of the Related Technology

Over the past decades, aggressive and continuous transistor scaling according to Moore's law has provided ever-increasing device performance and density in complementary metal oxide semiconductor (CMOS) technologies. For advanced nodes, e.g., sub-5 nm nodes and beyond, to continue the pace of growth, different approaches for further improvement that are being considered include improvements in materials, device architectures and/or circuits design. One of these approaches includes the gate-all-around (GAA) nanowire (NW) FET architecture, in which the gate electrode is fully wrapped around the thin body of the device, e.g., the channel region, which can be implemented in a lateral or vertical configuration, and may allow superior short-channel electrostatics (SCE) control. The GAA NW FET may define the ultimate scaling limit of conventional finFETs and one of the most promising candidates to further support the CMOS roadmap. At the same time, further cells scaling using conventional two-dimensional (2D) layouts is also becoming more and more challenged by key factors such as the physical or practical limits of forming gates and contacts and interconnect routing.

Some vertical nanowire (VNW) devices can particularly be well suited to overcome some of these limitations while exhibiting excellent SCE characteristics. However, fabricating such VNW devices may involve early process-design cross-disciplinary interactions to address the technological and design challenges/opportunities of moving from a 2D to a 3D layout configuration for CMOS.

In vertical nanowire (VNW) devices, since the gate length ($L_{gate}$) is defined vertically, the $L_{gate}$ can be relaxed without area penalty, which can in turn also allow some relaxation in the nanowire diameter, while maintaining control over the short-channel-effects. Moreover, $L_{gate}$ relaxation can also be an important knob for variability optimization and leakage control, especially critical for instance in scaled static random access memory devices (SRAMs).

However, to benefit from these advantages, a vertical device flow which is adapted to control of the thicknesses of the different layers surrounding the VNWs can be an important attribute, as controlling the thicknesses can determine $L_{gate}$, junction profiles (e.g., for conventional inversion-mode type of devices) and/or source/drain areas.

However, the current state of the art vertical device flows encounter different problems. One problem is associated with the etch-layout dependency of the vertical devices for both wet and dry-etch processes. Another problem which is observed is the non-uniform thickness of the layers surrounding the vertical nanostructures, which is can be crucial for defining gate length, junction profiles and source/drain regions.

There is thus a need for new vertical device process flows which solve these disadvantages.

SUMMARY OF CERTAIN INVENTIVE ASPECTS

It is an object of the disclosed technology to provide a method for forming a target layer surrounding a vertical nanostructure which is independent of layout dependency and wherein the formed target layer has a uniform thickness which is the target thickness of the final target layer.

The above objectives are accomplished by the method according to embodiments of the disclosed technology.

Particular and preferred aspects of the disclosed technology are set out in the accompanying independent and dependent claims. Features from the dependent claims may be combined with features of the independent claims and with features of other independent claims as appropriate and not merely as explicitly set out in the claims.

A first aspect relates to a method for providing a target layer surrounding a vertical nanostructure on a substrate surface, the method comprising: providing a vertical nanostructure extending outwardly from a substrate surface, the vertical nanostructure having a sidewall surface; the sidewall surface having an upper portion and a lower portion; providing a target layer along the sidewall surface of the vertical nanostructure and on the substrate surface; the target layer having a target thickness T on the substrate surface; providing a protection layer covering the target layer; the protection layer having an etch rate which is lower than the etch rate of the target layer; removing an upper portion of the protection layer, thereby exposing the target layer along the upper portion of the sidewall surface of the vertical nanostructure and leaving the target layer on the lower portion of the sidewall surface and on the substrate surface covered by the protection layer; thereafter etching the exposed target layer at most until the target thickness T is reached; thereafter removing the remaining protection layer.

According to embodiments of the disclosed technology, etching the exposed target layer comprises etching only the exposed target layer which is present along the upper portion of the sidewall surface of the vertical nanostructure.

According to embodiments of the disclosed technology, etching the exposed target layer comprises etching the exposed target layer which is present along the upper portion and along the lower portion of the sidewalls surface of the vertical nanostructure.

According to embodiments of the disclosed technology, removing an upper portion of the protection layer or removing the remaining protection layer comprises etching back the protection layer isotropically.

According to embodiments of the disclosed technology, etching back isotropically comprises etching with an $O_2$-based chemistry.

According to embodiments of the disclosed technology, the target layer comprises any of a nitride, amorphous silicon or polysilicon, a dielectric material, a low-k material, a spacer material, a gate stack material.

According to embodiments of the disclosed technology, etching back the exposed target layer comprises a F-based etch chemistry.

According to embodiments of the disclosed technology, the vertical semiconductor nanostructure comprises a conformal liner.

According to embodiments of the disclosed technology, the vertical semiconductor nanostructure forms part of a vertical semiconductor device.

According to embodiments of the disclosed technology, the target layer forms part of a gate stack of the vertical semiconductor device.

Figure 1:
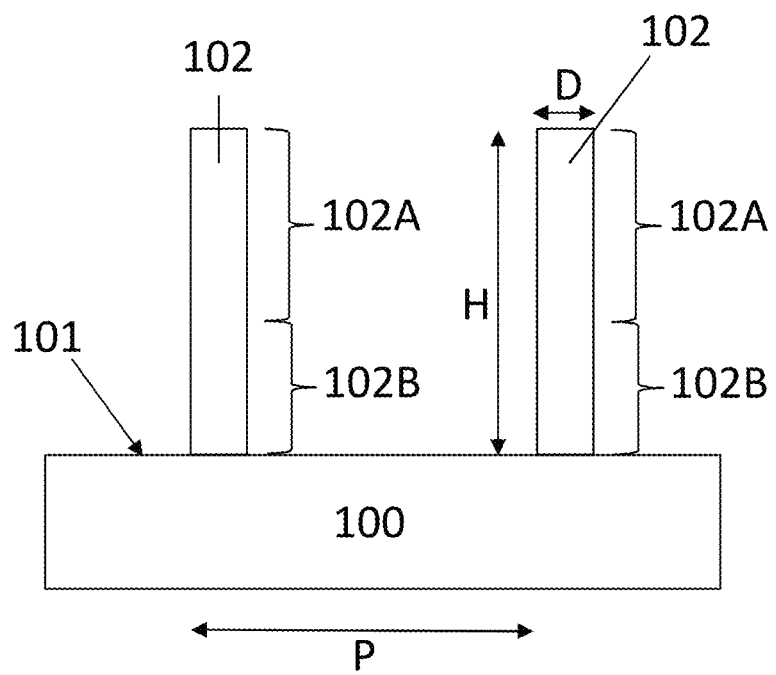
FIGS. 1 to 9 schematically illustrate intermediate structures that are formed at various steps of a process flow for forming a target layer surrounding a vertical nanostructure, according to embodiments of the disclosed technology.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The disclosure will be further elucidated by means of the following detailed description of several embodiments of the disclosure and the appended figures.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

"Horizontal" refers to a general direction along or parallel to a primary surface of a substrate, and "vertical" is a direction generally orthogonal thereto. "Horizontal" and "vertical" are used as generally perpendicular directions relative to each other independent of the orientation of the substrate in the three-dimensional space.

In the following, certain embodiments will be described with reference to a silicon (Si) substrate, but it should be understood that embodiments are not so limited, and various embodiments can equivalently be implemented on other semiconductor substrates. In embodiments, the substrate may include a semiconductor substrate such as, e.g., a silicon, a germanium (Ge), or a silicon germanium (SiGe) substrate, a gallium arsenide (GaAs), a gallium arsenide phosphide (GaAsP), an indium phosphide (InP). The substrate may include, for example, an insulating layer, e.g., an embedded insulating later such as a $SiO_2$ or a $Si_3N_4$ layer in addition to a semiconductor substrate portion. Thus, various embodiments may also be implemented on silicon-on-insulator (SOI) technologies, e.g., silicon-on-glass or silicon-on-sapphire substrates. The term substrate is thus used to define generally the elements for layers that underlie a layer or portions of interest. Also, the substrate may include any other base on which a layer is formed, for example a glass layer or metal layer as part of a metallization layer. Accordingly, a substrate may be a wafer such as a blanket wafer or may be a layer applied to another base material, e.g., an epitaxial layer grown on a lower layer.

As described herein, a nanostructure may be a structure which is defined by a height H, a width or diameter W and a length L, in which at least one cross-sectional dimension (for example a height or/and a width or/and a diameter) is less than 20 nm or less than 10 nm. The aspect ratio (length versus width of the nanostructure) may be greater than 10, greater than 100, or greater than 1000. Exemplary embodiments of a nanostructure may be an elongated nanostructure such as a nanosheet or a nanowire. Other terms which may be used as examples of a nanostructure include a nanopillar, a nanorod, a nanocolumn, or a nanocone. Further exemplary embodiments of a nanostructure may be fin-type structures, which are analogous to a nanosheet, but have relatively larger cross-sectional dimensions.

Figure 2:
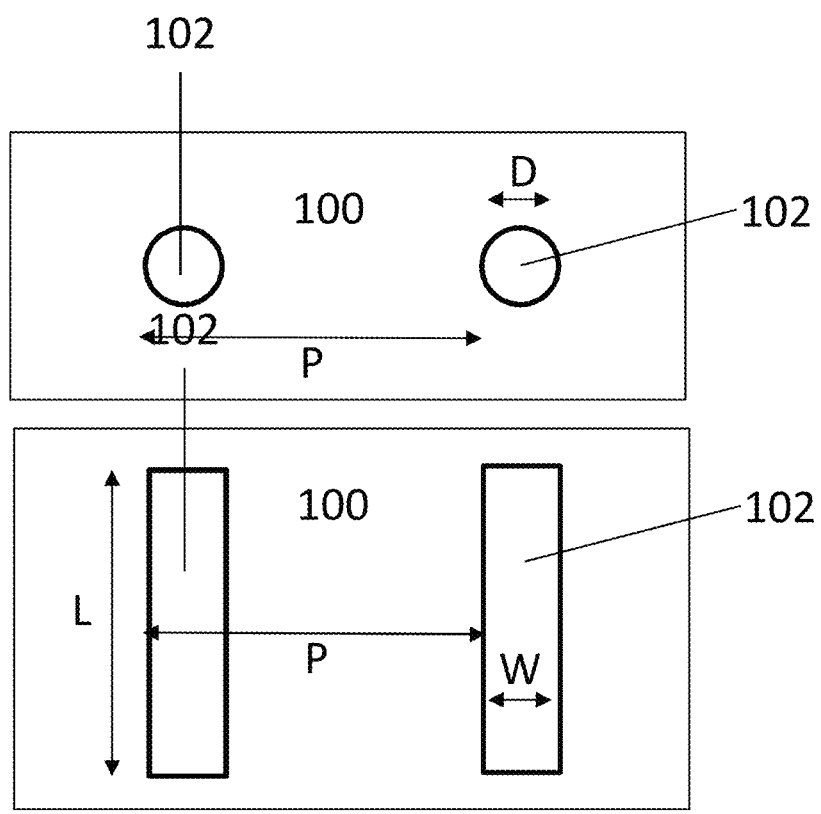

FIGS. 1 to 9 schematically illustrate intermediate structures that are formed at various steps of a process flow for forming a target layer surrounding a vertical nanostructure, according to embodiments of the disclosed technology. The process or manufacturing method comprises providing a substrate 100 comprising a vertical nanostructure 102 extending outwardly from the substrate surface 101. The substrate 100 has a substrate surface 101 as shown in the intermediate structure of FIG. 1, from which a vertical nanostructure 102 is extending. The substrate 100 comprises at least one vertical nanostructure 102. The substrate 100 may thus comprise more than one vertical nanostructure 102, for example two vertical nanostructures 102 as shown as an example in FIG. 1. In FIG. 2, a top view of the intermediate structure of FIG. 1 is shown. As illustrated in FIG. 2, the nanostructure 102 can have a circular sidewall surface (such as for example a nanowire or nanotube) (FIG. 2A), and/or for a nanostructure 102 having a rectangular sidewall surface (such as, for example, a nanosheet or a fin-like structure) (FIG. 2B).

According to embodiments, the vertical nanostructure 102 may comprise a vertical nanowire. Vertical nanowires 102 may be formed using suitable techniques, depending on the targeted application. For example, for the application of vertical nanowire devices such as vertical field-effect transistors VFETs, the device integration involves a channel-first or channel-last process flow. For the first case, for example, a top-down approach may be used wherein the vertical nanowire is defined, e.g., with the use of 193 nm immersion lithography, followed by a dry-etch process, strip and clean. An alternative way for forming vertical nanowires is a bottom-up approach, wherein the nanowire is selectively grown on an oxide template defined by advanced patterning. In a channel-last process flow, a hole having vertical sidewalls is etched through a sandwich stack, after which selective epitaxial growth (SEG) followed by chemical mechanical polishing (CMP) is performed to fill the hole. This approach is quite attractive in terms of the simplicity and process control as it allows for the definition of the gate stack with a replacement metal gate (RMG) scheme, a module which enables further options for device fabrication such as decoupling the gate module from the doping/series resistance optimization for the top part of the NW.

Still another method for forming vertical nanowires involves vapor-liquid-solid (VLS) deposition method, which comprises forming of metal catalyst nanodots, followed by vertical nanowire growth by vapor-liquid-solid (VLS) deposition from the metal catalyst, and thereafter removing the metal catalyst.

Figure 3:
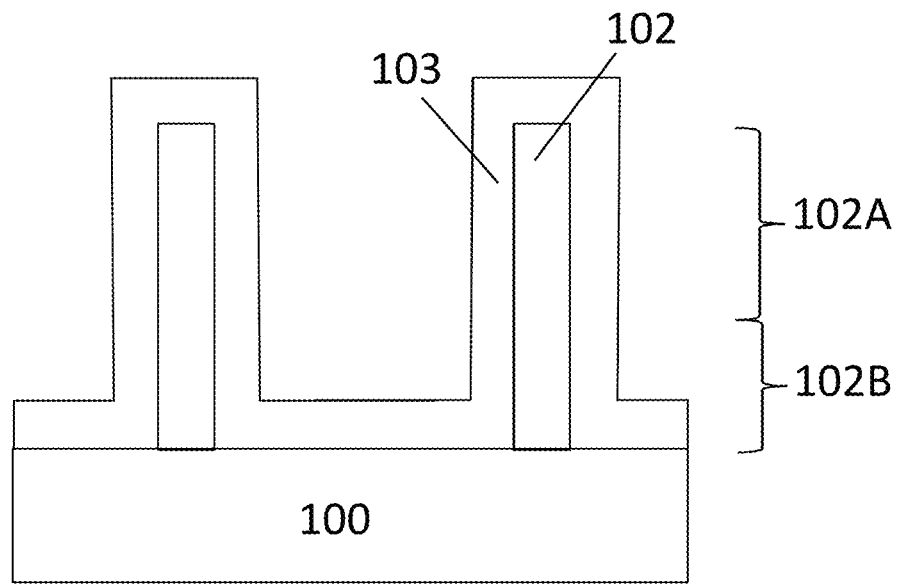

Still referring to FIG. 1, the vertical nanostructure 102 has a sidewall surface. As illustrated in FIG. 2, the sidewall surface shape may be circular, for example for a vertical nanowire or a vertical nanotube, or may be rectangular, for example for a nanosheet or a fin-like structure. Referring to FIG. 3, an upper portion 102A and a lower portion 102B of the vertical nanostructure 102, and respectively an upper portion and a lower portion of the sidewall surface of the vertical nanostructure are defined.

The distance or spacing between corresponding features of different nanostructures 102, which may periodically repeat, is sometimes referred to as the pitch P. Depending on the application, the pitch may differ and different layouts are possible for the vertical nanostructures. For example, for FET applications, the nanostructures 102 may be formed to have a relatively small pitch (for example, below 100 nm depending of the targeted technology node), whereas, for example, for single-photon source applications, a larger pitch (e.g., greater than 1 micrometer) may be used.

It is an advantage of the method of providing a target layer surrounding a vertical nanostructure on a substrate according to embodiments of the disclosed technology that independent of the layout, otherwise said independent of the pitch between different vertical nanostructures, a uniform target layer may be provided. In some embodiments, the target layer may have a uniform thickness along the substrate surface. As described herein, a uniform thickness refers to a thickness variation that is relatively low, e.g., a uniformity level corresponding to the deposition technique used for depositing the target layer. For example, layers deposited using atomic layer deposition (ALD) are known to have excellent uniformity and conformality.

It is an advantage of the method for providing a target layer surrounding a vertical nanostructure on a substrate according to embodiments of the disclosed technology, wherein an initial target layer is first formed and after providing the method according the embodiments of the disclosed technology a final target layer is formed wherein the thickness of the final target layer present in between the vertical nanostructure along the substrate surface is equal to the initial thickness of the initial target layer.

According to embodiments the vertical nanostructure is a vertical semiconductor nanostructure. The vertical semiconductor nanostructure 102 may comprise a semiconductor material such as, for example, Si, SiGe, a III-V material or other suitable semiconductor compounds.

The vertical semiconductor nanostructure 102 may comprise one or more regions such as for example a channel region, a source/drain region which may be doped or undoped.

The at least one vertical nanostructure is extending outwardly or protruding from the substrate surface. This means that the vertical nanostructure is surrounded by the substrate surface.

As shown in FIG. 3 a target layer 103, also referred to the as-formed target layer, is provided on the vertical nanostructure 102 and on the substrate surface 101, more specifically along the sidewall surface of the vertical nanostructure 102 and on the substrate surface 101. More precisely, the target layer 103 is provided in a manner such that the as-formed thickness T of the target layer 103 on the substrate surface (e.g., adjacent to the vertical nanostructure 102) is uniform along the substrate surface. The thickness of the as-formed target layer 103 on the substrate surface is defining the final thickness T of the final target layer after providing all the steps for the method according to embodiments of the disclosed technology. The final thickness is thus substantially the same as the initial thickness T of the as-formed target layer Along the sidewall surfaces of the nanostructure 102, some non-uniformity can be tolerated, as the final target layer 103B, 103C will be that part of the as-formed target layer 103 which is present adjacent to the vertical nanostructure 102 on the substrate surface, and not the part of the as-formed target layer 103 which is present along the sidewall of the nanostructure 102. However, preferably, the target layer 103 is provided with a uniform thickness and conformal along the vertical nanostructure 102 and the substrate surface. For example, for a dense pitch in between the vertical nanostructures 102 a good control of the thickness of the target layer 103 can be desirable between the vertical nanostructures 102. Therefore, conformal deposition techniques such as atomic layer deposition (ALD) may be employed. However, embodiments are not so limited. For more relaxed pitch, e.g., the target layer may not be conformal along the patterned structure. However, it may be desirable to have at least that part of the target layer 103 along the substrate surface between the vertical nanostructures 102 to have a uniform thickness.

Figure 4:
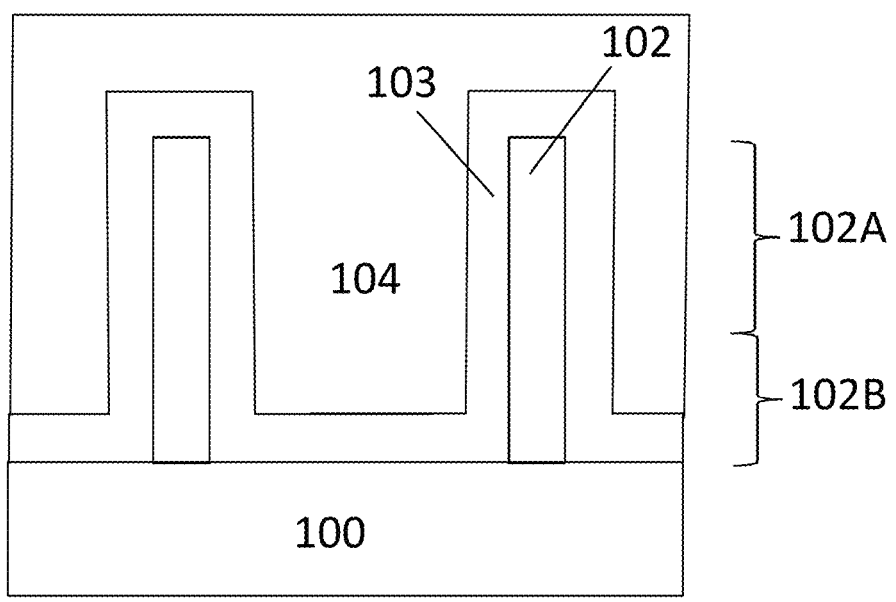

Referring to FIG. 4, after providing the target layer (the as-formed target layer) 103, a protection layer 104 is provided covering the as-formed target layer 103. Depending on the material of the vertical nanostructure 102, a different protection layer 104 may be chosen. According to embodiments, the protection layer 104 may comprise a resist material. This may, for example, be advantageous for Si-comprising vertical nanostructures (which may further comprise an oxide liner), as the process parameters such as etch chemistries, deposition parameters for resist are well-known. According to alternative embodiments, the protection layer may comprise an oxide. This may be advantageous for III-V-comprising vertical nanostructures as an oxide liner is not needed in this case. According to alternative embodiments the protection layer may comprise a spin-coating material such as spin-on-glass (SOG) or spin-on-carbon (SOC).

According to embodiments, the etch rate of the protection layer 104 is preferably lower than the etch rate of the target layer 103.

Figure 5:
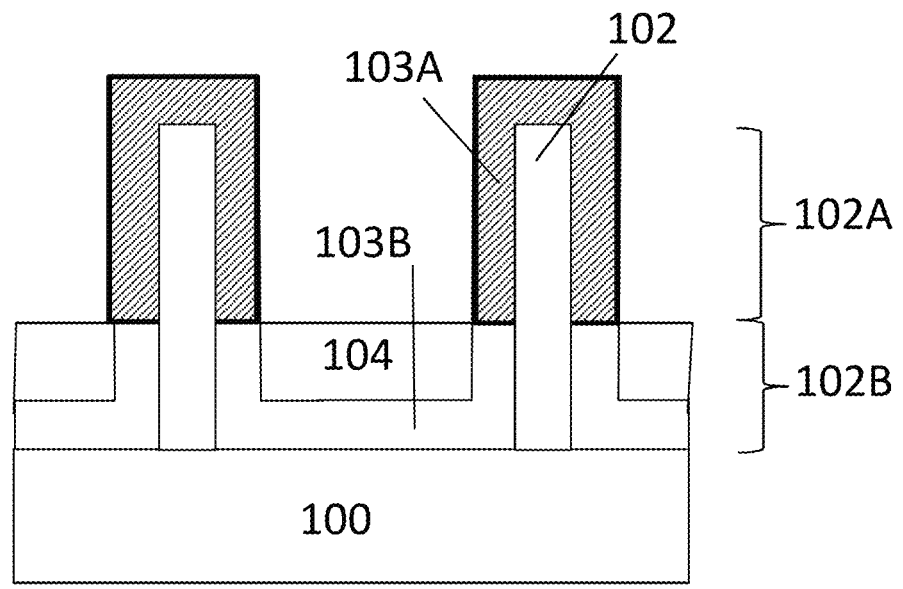

Referring to FIG. 5, after providing the protection layer 104, upper portion of the protection layer 104 is removed, thereby exposing the target layer 103 along the upper portion 102A of the sidewall surface of the vertical nanostructure 102 (also referred to as the exposed target layer 103A) and leaving the target layer 103 along the lower portion 102B of the sidewall surface of the vertical nanostructure 102 unexposed (and thus covered by the protection layer 104) and leaving the target layer 103 on the surrounding substrate surface 101 unexposed (and thus covered by the protection layer 104). The unexposed part of the target layer 103 may be referred to as the unexposed target layer 103B, 103C as shown in FIGS. 6, 7.

According to embodiments of the disclosed technology, removal of upper portion of the protection layer 104 may comprise etching upper portion of the protection layer 104. For example, an $O_2$-based etch chemistry may be used to isotropically etch-back a protection layer 104 comprising a resist material.

According to embodiments, removing the upper portion of the protection layer 104 comprises removing an upper portion having a predetermined thickness of the protection layer. The thickness may be determined based on the possible selectivity to the protection layer in the following removal step (i.e. removal of an upper portion of the target layer).

Figure 6:
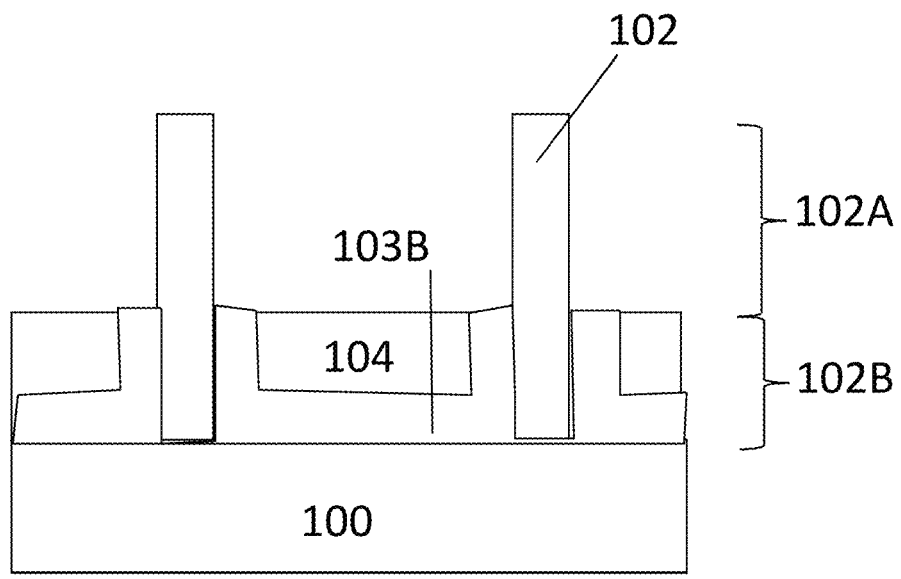
Figure 7:
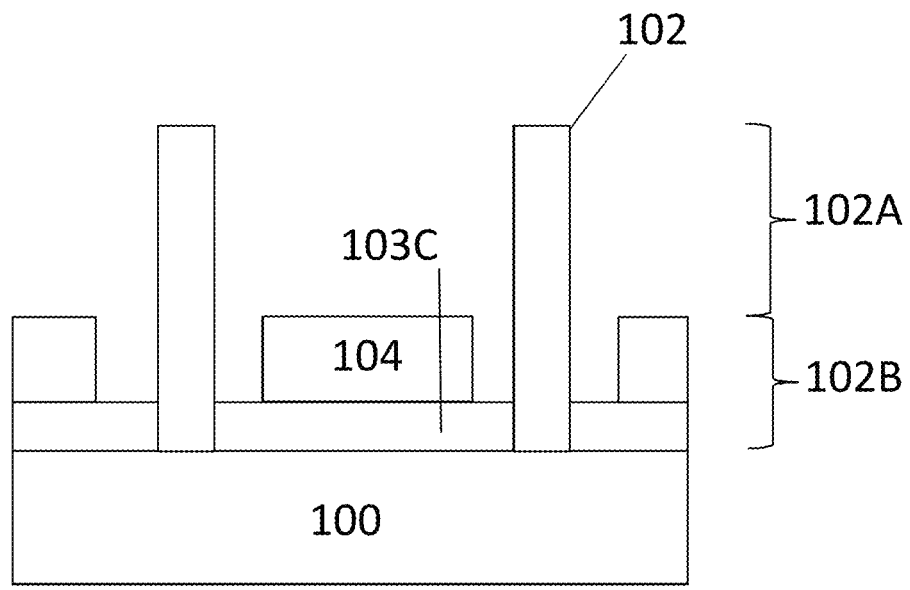

Referring to FIG. 6, after removing the upper portion of the protection layer 104, the exposed target layer 103B is etched. The exposed target layer 103 may be etched until the thickness T as this is the final thickness of the target layer to be achieved. The target layer 103 is thus etched towards the protection layer 104. As a result, only a bottom portion of the target layer 103B, 103C remains present. Depending on the material comprised in the target layer and in the protection layer a specific etch chemistry may be used as known for a person skilled in the art.

As an example, when the target layer 103 includes or is formed of SiN, and when the protection layer comprises 104 includes or is formed of a resist material, upper portion of the SiN-based target layer 103 may be removed selective to the resist using an F-based chemistry such as $SF_6$-based or $NF_3$-based chemistry.

Etching the exposed target layer 103B has the effect that the final thickness or height of the final target layer is set in the area uncovered with the protection layer. FIG. 6 shows a possible embodiment wherein an upper portion of the target layer 103A is removed thereby defining the final target layer, which comprises part of the target layer which is uniform along the substrate surface and an lower portion of the target layer still present along the lower portion of the sidewall surface of the vertical nanostructure 102B. FIG. 7 shows another possible embodiment wherein a further portion of the unexposed target layer 103B is removed, more specifically the portion of the target layer still present along the lower portion of the sidewall surface of the vertical nanostructure, which is portion of the unexposed target layer which is present in between the protection layer and the vertical nanostructure. This results in a final target layer 103C which only comprises that part of the as-formed target layer which is uniformly present along the substrate surface.

Figure 8:
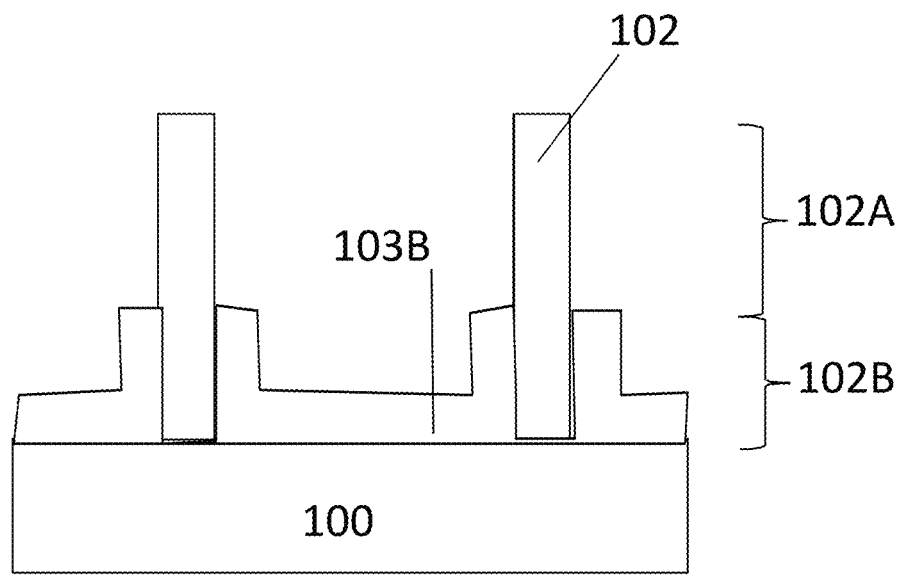
Figure 9:
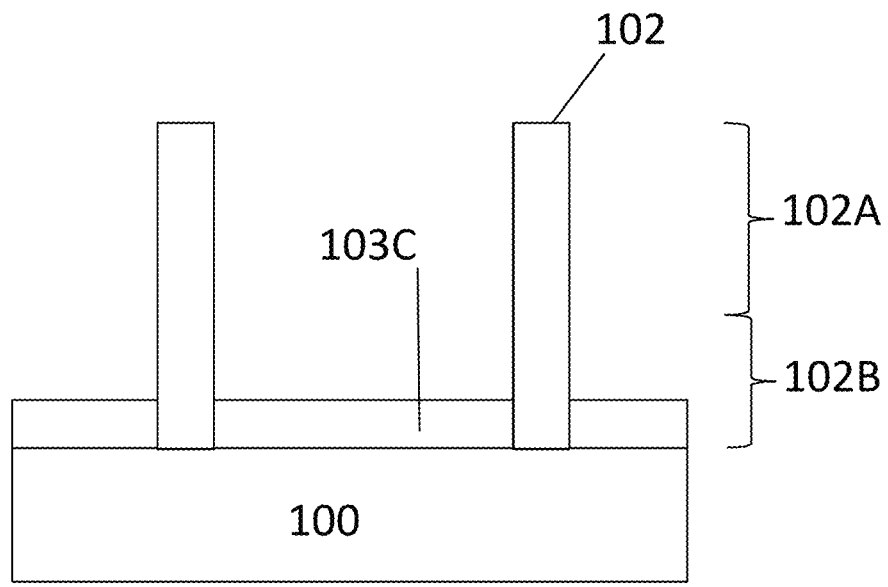

After etching the exposed target layer, the remaining protection layer 104 is removed thereby resulting in the final target layer 103B, 103C having a uniform thickness in between the vertical nanostructures as shown in FIG. 8 and FIG. 9 for different alternative embodiments of the disclosed technology.

Experimental Results

Figure 10:
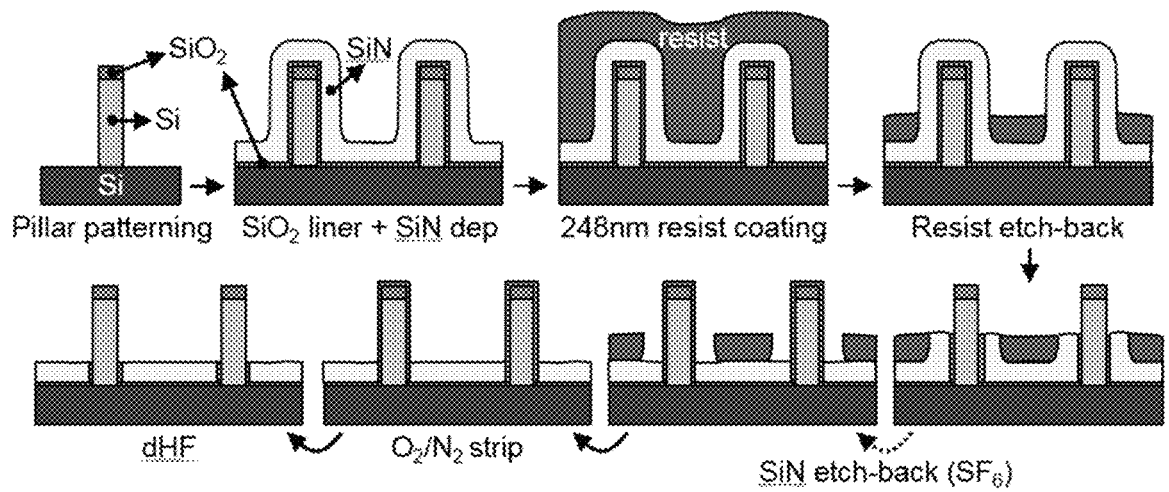
FIG. 10 schematically illustrates intermediate structures that are formed at various steps of a process flow for forming a target layer surrounding a vertical nanostructure, according to embodiments of the disclosed technology.
Figure 11A:
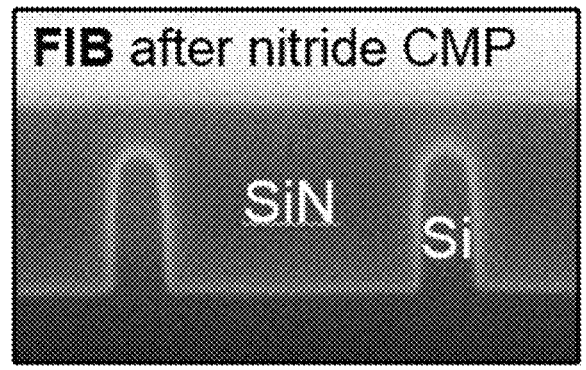
FIGS. 11A-11C show scanning electron microscopy (SEM) images which show the disadvantages and artifacts of target layers deposited between two vertical nanostructures by using some methods.
Figure 11B:
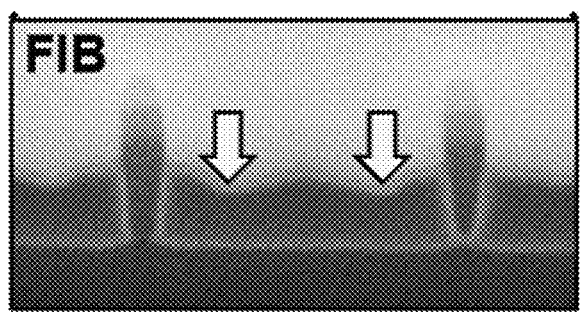
Figure 11C:
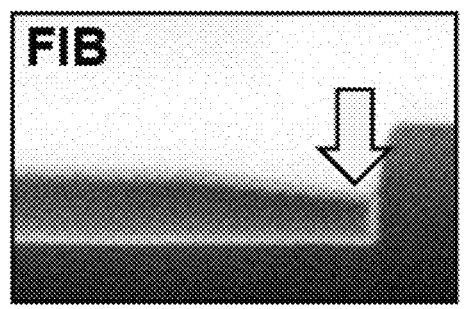

In a vertical device flow, control of the thicknesses of the different layers surrounding the nanowire (NW) pillars is key as that will determine $L_{gate}$, junction profiles (for conventional inversion-mode type of devices) and S/D areas. FIG. 11A-11C illustrate some of the challenges faced when etching-back layers in-between NW pillars on the wafer, such as oxide or nitride (FIG. 11A), after their deposition and planarization by chemical mechanical polishing (CMP): considerable etch-layout dependences for both wet (FIG. 11B) and dry-etch (FIG. 11C) processes are observed, preventing realization of pillars with layers of well-defined thickness surrounding them. This can be observed in the irregularities of the thickness profile in between the NW pillars as shown in FIG. 11B as well as thickness variation at the sidewall of the NW pillars as shown in FIG. 11C. To overcome these issues, the alternative approach according to embodiments of the disclosed technology providing a target layer, otherwise said for (partially) etching-back (target) layers which is schematically illustrated in FIG. 10. It ensures that the thickness of the target layer obtained around the pillars is essentially its as-deposited thickness, everywhere on the wafer, independently of the mask set layout used. This scheme comprises according to an example according to embodiments of the disclosed technology of the following steps (FIG. 10):

1) starting from vertical NW pillars (with or without a hard-mask on top), a thin-oxide liner and a nitride layer are deposited on the wafer;
2) a 248 nm litho resist is coated on the wafer;
3) the resist is etched-back isotropically using an $O_2$-based plasma, stopping at a targeted resist thickness ($t_{target,resist}$) in the areas in-between pillars, and with $t_{target,resist}$ determined by the etch selectivity towards resist during the next etch step;
4) an isotropic etch is performed to etch-back the nitride layer (30,31) in areas not covered by resist (using a F-based chemistry) and set its final height or thickness there;
5) the resist is removed by a $O_2/N_2$-based strip; and finally
6) the exposed part of the oxide liner can be removed with a short diluted HF (dHF) or a siconi/dHF process.

Figure 12:
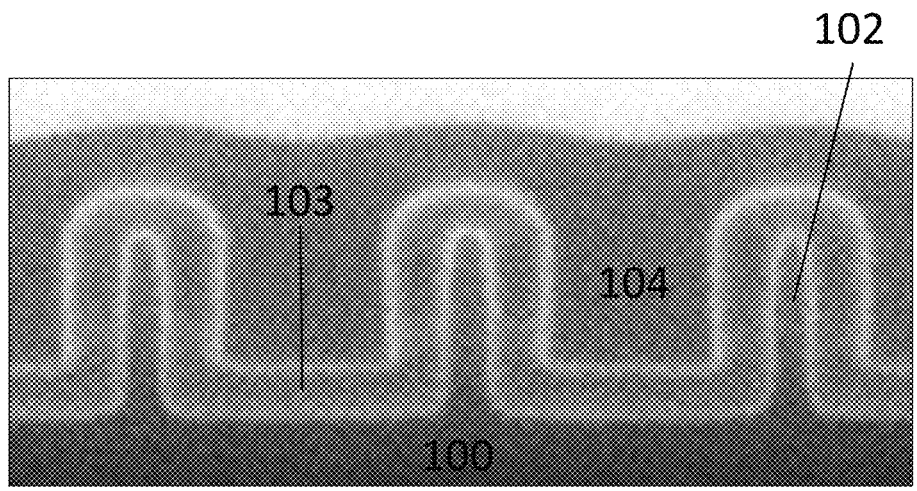
FIGS. 12-14 show scanning electron microscopy (SEM) images of intermediate structures that are formed at various steps of a process flow for forming a target layer surrounding a vertical nanostructure, according to different embodiments of the disclosed technology.
Figure 13:
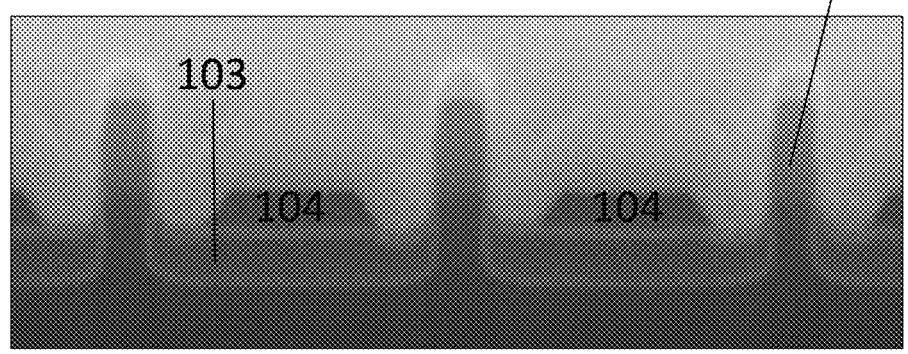
Figure 14:
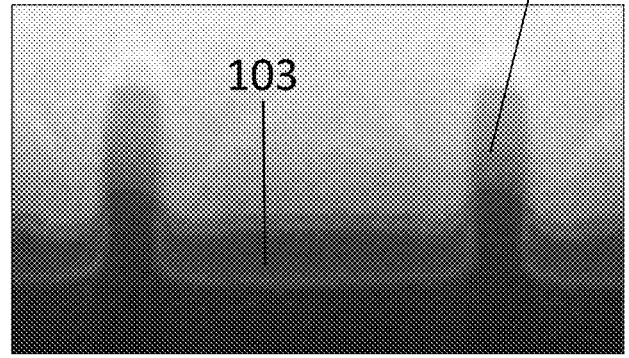

Examples of scanning electron microscopy (SEM) images at different stages of this process scheme are shown in FIGS. 12-14. FIG. 12 shows a SEM image after resist coating. FIG. 14 shows a SEM image after nitride etch (removal of upper portion of the target layer) and FIG. 15 shows a SEM image of a zoom of 2 NW pillars after strip of the resist (i.e. removal of the remaining protection layer) thereby having formed a SiN layer in between the NW pillars with uniform thickness and without any irregularities or thickness variations.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method of forming a semiconductor device, the method comprising:
   providing a substrate having a substrate surface;
   forming a vertical nanostructure extending outwardly from the substrate surface, the vertical nanostructure having a sidewall surface, the sidewall surface having an upper portion and a lower portion;

forming a target layer along the sidewall surface of the vertical nanostructure and on the substrate surface, the target layer having a target thickness on the substrate surface;

forming a protection layer covering the target layer, wherein the protection layer has an etch rate under an etch condition that is lower than an etch rate of the target layer under the etch condition;

removing an upper portion of the protection layer, thereby exposing the target layer along the upper portion of the sidewall surface of the vertical nanostructure;

after removing the upper portion of the protection layer, etching the exposed target layer under the etch condition at most until the target thickness is reached, wherein etching the exposed target layer forms a recess between the vertical nanostructure and the protection layer; and after etching the exposed target layer, removing the remaining protection layer.

2. The method according to claim 1, wherein etching the exposed target layer comprises etching only the exposed target layer which is present along the upper portion of the sidewall surface of the vertical nanostructure.

3. The method according to claim 1, wherein etching the exposed target layer comprises etching the exposed target layer which is present along the upper portion and along the lower portion of the sidewalls surface of the vertical nanostructure.

4. The method according to claim 1, wherein removing an upper portion of the protection layer or removing the remaining protection layer comprises etching back the protection layer isotropically.

5. The method according to claim 4, wherein etching back isotropically comprises etching with an $O_2$-based chemistry.

6. The method according to claim 1, wherein the target layer comprises one of a nitride, amorphous silicon, polysilicon, a dielectric material, a low-k material, a spacer material or a gate stack material.

7. The method according to claim 1, wherein the etch condition under which the exposed target layer is etched comprises a F-based etch chemistry.

8. The method according to claim 1, wherein the vertical nanostructure comprises a conformal liner.

9. The method according to claim 1, wherein the vertical nanostructure forms part of a vertical semiconductor device.

10. The method according to claim 9, wherein the target layer forms part of a gate stack of the vertical semiconductor device.

11. The method according to claim 1, wherein etching the exposed target layer is such that the thickness of the target layer along the substrate surface is substantially uniform.

12. The method according to claim 1, wherein the protection comprises a resist, and wherein one or both of removing the upper portion of the protection layer and removing the remaining protection layer comprises oxidizing the resist with an oxygen-based chemistry.

13. The method according to claim 1, wherein etching the exposed target layer comprises etching until the target thickness is reached.

14. The method according to claim 1, wherein forming a protection layer covering the target layer comprises forming the protection layer having a thickness such that an upper surface of the protection layer is above a top surface of the vertical nanostructure.

15. The method according to claim 1, wherein the target layer is formed of a silicon nitride.

* * * * *